(12) United States Patent
Huang et al.

(10) Patent No.: US 6,380,082 B2
(45) Date of Patent: *Apr. 30, 2002

(54) METHOD OF FABRICATING CU INTERCONNECTS WITH REDUCED CU CONTAMINATION

(75) Inventors: Chih-Ming Huang, Hsinchu; Tsu-An Lin, Taichung, both of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/250,631

(22) Filed: Feb. 16, 1999

(30) Foreign Application Priority Data

Dec. 16, 1998 (TW) .......................................... 87120925

(51) Int. Cl.$^7$ ....................... H01L 21/4763; H01L 21/44
(52) U.S. Cl. ..................... 438/687; 438/624; 438/628; 438/627; 438/638; 438/653; 438/654; 438/672; 438/675
(58) Field of Search ................................. 438/687, 757, 438/688, 685, 634, 627, 624, 628, 638, 637, 639, 653, 654, 673, 672, 675, 724, 735

(56) References Cited

U.S. PATENT DOCUMENTS

| 5,635,423 | A | * | 6/1997 | Huang et al. | 438/638 |
|---|---|---|---|---|---|
| 5,795,823 | A | * | 8/1998 | Avanzino et al. | 438/639 |
| 5,904,565 | A | * | 5/1999 | Nguyen et al. | 438/687 |
| 5,913,147 | A | * | 6/1999 | Dublin et al. | 438/687 |
| 6,156,648 | A | * | 12/2000 | Huang | 438/654 |

* cited by examiner

Primary Examiner—Ha Tran Nguyen
(74) Attorney, Agent, or Firm—J. C. Patents

(57) ABSTRACT

An improved method of preventing copper poisoning in the fabrication of metal interconnects on a semiconductor substrate comprises sequential formation of a copper layer, a first stop layer, a first inter-metal dielectric layer, a second stop layer, and a second inter-metal dielectric layer over the substrate. The second inter-metal dielectric layer and the second stop layer are defined to form an opening. A conformal first glue/barrier layer is formed over the substrate. The first glue/barrier layer and the first inter-metal dielectric layer are patterned to form a via hole below the opening until the first stop layer is exposed. Spacers are formed on sidewalls of the opening and the via hole below the opening. The first stop layer at bottom of the via hole is removed to expose the copper layer.

20 Claims, 5 Drawing Sheets

METHOD OF FABRICATING CU INTERCONNECTS WITH REDUCED CU CONTAMINATION

CROSS-REFERENCE TO RELATED APPLICATION

This application claims the priority benefit of Taiwan application Ser. No. 87120925, filed Dec. 16, 1998.

BACKGROUND OF THE INVENTION

1. Field of Invention

The present invention relates to a semiconductor process. More particularly, the present invention relates to a method for fabricating metal interconnects.

2. Description of Related Art

With the increase of integration in integrated circuits (IC), a conventional wafer can no longer provide sufficient area for interconnects. In order to satisfy performance requirements, design rules for forming more than two metal layers for interconnects are gradually applied in integrated circuits. Therefore, in current very large scale integration (VLSI) processes, difficulty of fabricating metal interconnects with better reliability and good conductivity is gradually increasing. At present, aluminum is commonly used as an interconnect material. Copper can provide good conductivity in a small contact surface, therefore, with the increasing integration in semiconductor devices, copper with low resistivity is gradually replacing aluminum.

Copper has advantages of low resistivity, high electromigration resistance, and a high melting point (melting point of copper is about 1060° C., and melting point of aluminum is about 660° C.). A conductive line made of copper can provide better performance than an aluminum conductive line, and reduces RC delay time. However, at this time, a better method of etching copper conductive lines has not found so as to restrict the use of copper.

One conventional method for solving the aforementioned problems is to form a dielectric layer over a substrate after a plug is formed. The dielectric layer is as thick as a desired metal line. The dielectric layer is defined to form an opening in the dielectric layer. The opening is filled with a conductive layer to form a metal line.

Another method is to simultaneously form a via hole and an opening. A conductive layer is deposited to fill the via hole and the opening. A metal interconnect is formed. Since these solution methods do not directly etch the metal line, the methods can overcome the difficulty of etching a metal line made of copper.

FIGS. 1A through 1C are schematic, cross-sectional views showing a conventional method of fabricating metal interconnects.

As shown in FIG. 1A, a semiconductor substrate 100 is provided, and preformed devices such as transistors (not shown) are formed on the substrate 100. An insulating layer (not shown) is formed over the substrate 100. A copper layer 102 is formed over the insulating layer as a conductive line. A silicon nitride layer 104 and an inter-metal dielectric layer (IMD) 106 are subsequently formed on the copper layer 102 by chemical vapor deposition (CVD). Another silicon nitride layer 108 and another inter-metal dielectric layer 110 are subsequently formed on the inter-metal dielectric layer 106. The silicon nitride layer 108 and the inter-metal dielectric layer 110 are defined to form openings 112, 114 until the inter-metal dielectric layer 106 is exposed.

As shown in FIG. 1B, the inter-metal dielectric layer 106 and the silicon nitride layer 104 are defined to form a via hole 116 below the opening 114 until the copper layer 102 is exposed. The definition step includes forming a patterned photoresist layer 118 over the substrate 100. A portion of the inter-metal dielectric layer 106 and the silicon nitride layer 106 are anisotropically etched to form the via hole 116.

As shown in FIG. 1C, the photoresist layer 118 (FIG. 1B) is removed. A conformal tantalum nitride layer 120 is formed over the substrate 100. Since adhesion between copper and dielectrics is poor, and copper atoms hastened by an electric field diffuse through the dielectric layers, the tantalum nitride layer 120 is formed as a glue/barrier layer to increase adhesion between copper and dielectric layers, and to stop the diffusion of copper atoms. A copper layer 122 is formed on the tantalum nitride layer 120 to fill the via hole 116 and the openings 112, 114. Using the inter-metal dielectric layer 110 as an etching end point, a portion of the copper layer 122 is removed by chemical-mechanical polishing (CMP). At this step, a metal interconnect is formed.

In the aforementioned process, the tantalum nitride layer 120 is used as a barrier layer to stop copper atoms and copper ions from diffusing into the inter-metal dielectric layer 106. But while forming the via hole 116, the inter-metal dielectric layer 106 and the silicon nitride layer 104 are anisotropically etched to expose the copper layer 102; at that time the tantalum nitride layer 120 is not yet formed. The silicon nitride layer 104 is continuously over-etched so that a portion of copper atoms or copper ions 102a is disassociated from the surface of the exposed copper layer 102, as seen in FIG. 1B. The copper atoms and copper ions easily remain at the via hole 116 bottom and on the via hole 116 sidewalls so that the chance of contamination by copper atoms or copper ions 102a (FIG. 1B) is thus increased. Moreover, after the etching step, a cleaning step is performed to clean the remaining etchants. The copper atoms or copper ions 102a (FIG. 1B) remaining at the via hole 116 bottom are taken out to the via hole 116 and the opening 114 by the cleaning step so that the copper atoms or copper ions 102a (FIG. 1B) remain on the sidewalls of the via hole 116 and the opening 114. Since, in this step, the inter-metal dielectric layers 106 and 110 are not yet covered with the tantalum nitride layer 120, the copper atoms (or copper ions) 120a diffuse into the inter-metal dielectric layers 106 and 110. Thus, in a later thermal process, copper atoms (or copper ions) 120a would diffuse in the inter-metal dielectric layer 106 more rapidly and more deeply, further diffusing into preformed devices on the substrate 100 and contaminating the substrate 100, leading to changed device properties. In addition, unexpected electrical connection caused by the diffusion of the copper atoms or copper ions is generated between two isolated metal layers so as to decrease reliability of the metal interconnects.

SUMMARY OF THE INVENTION

Accordingly, the purpose of the present invention is to provide a method for fabricating metal interconnects. The method can avoid contaminating devices on a substrate with copper atoms or copper ions so as to increase reliability and performance of devices. In addition, unexpected electrical connection between two dielectric layers caused by the diffusion of the copper atoms or copper ions can also be avoided.

To achieve these and other advantages and in accordance with the purpose of the invention, as embodied and broadly described herein, the invention provides a method for fabricating metal interconnects on a semiconductor substrate. The method comprises sequentially forming a copper layer, a first stop layer, a first inter-metal dielectric layer, a second stop layer, and a second inter-metal dielectric layer over the substrate. The second inter-metal dielectric layer and the second stop layer are defined to form an opening. A conformal first glue/barrier layer is formed over the substrate. The first glue/barrier layer and the first inter-metal dielectric layer are defined to form a via hole below the opening until the first stop layer is exposed. Spacers are formed on sidewalls of the opening and the via hole below the opening. The first stop layer at bottom of the via hole is removed to expose the copper layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
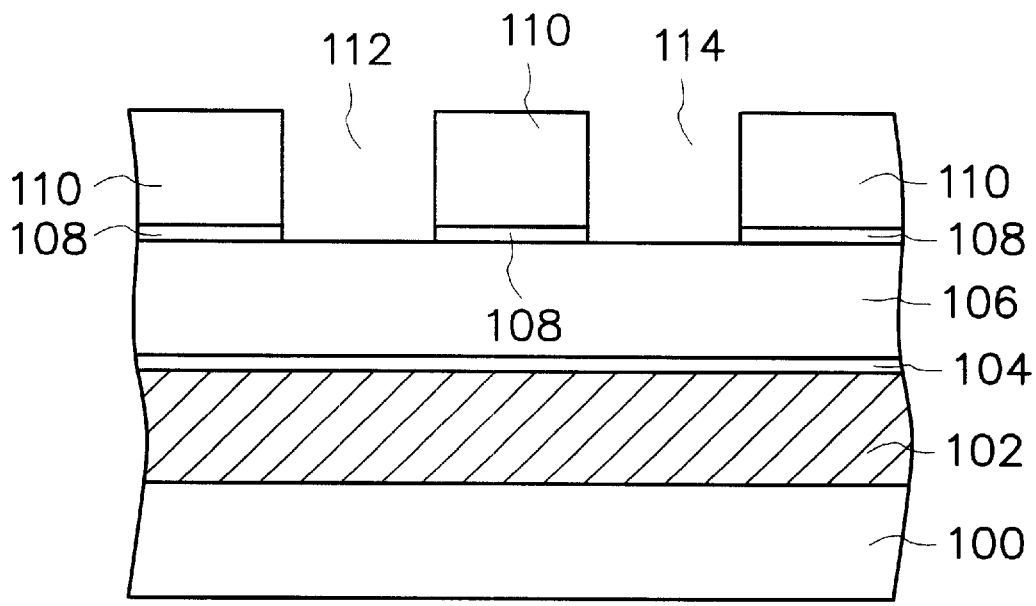
FIGS. 1A through 1C are schematic, cross-sectional views showing a conventional method of fabricating metal interconnects.
Figure 1B:
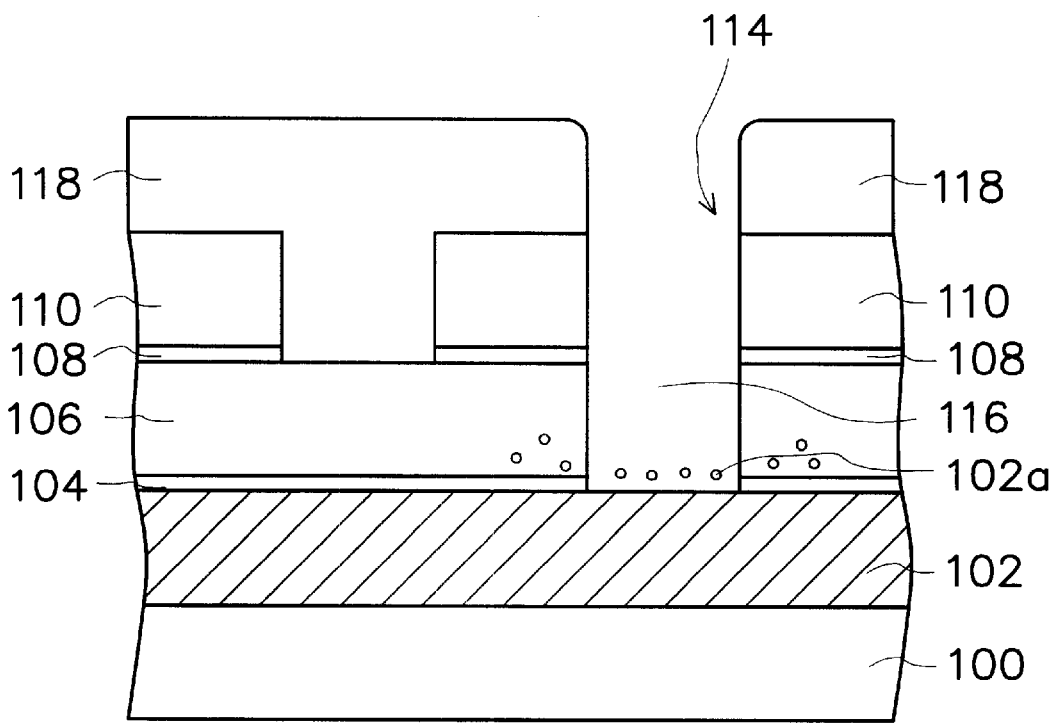
Figure 1C:
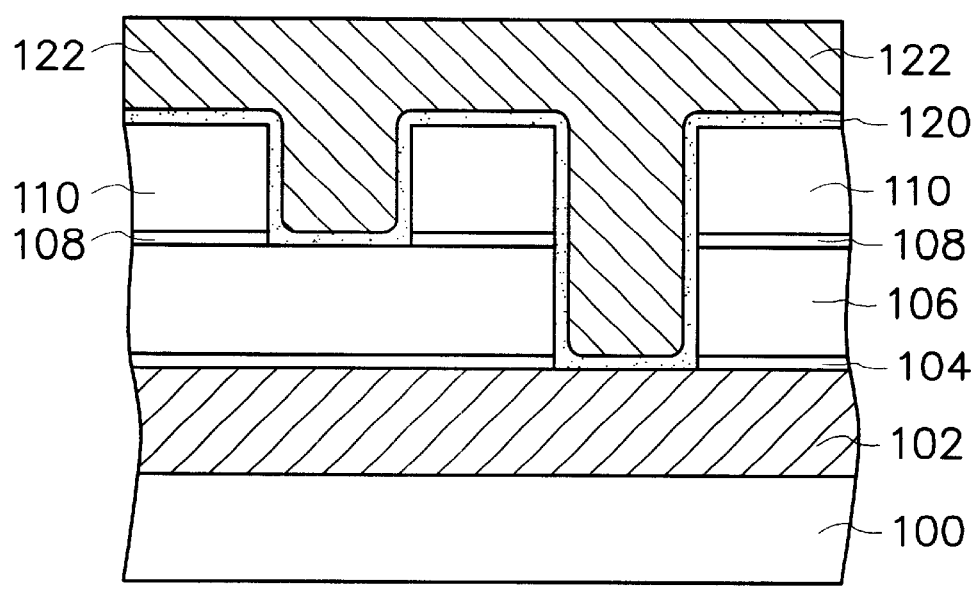

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional views showing a method of fabricating metal interconnects according to one preferred embodiment of this invention.

Figure 2A:
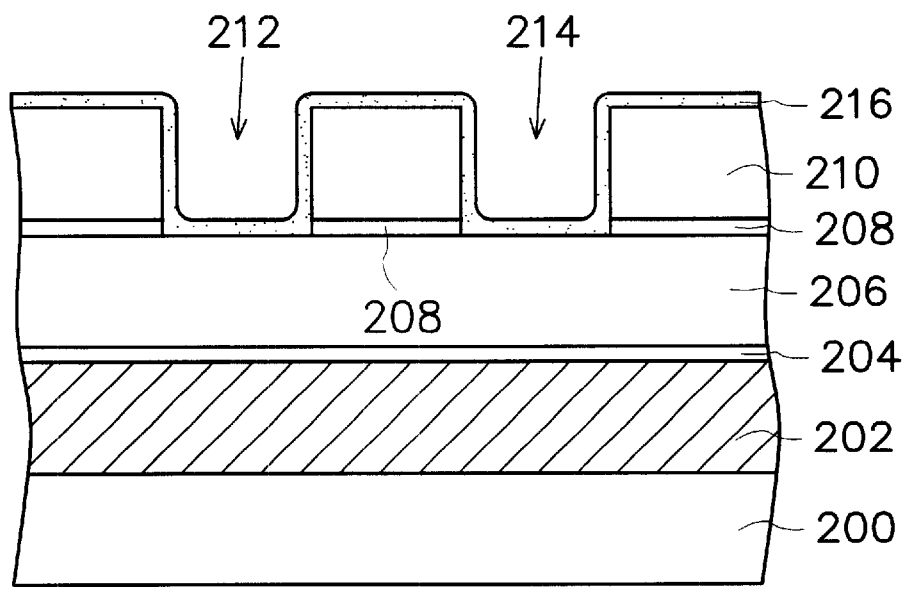
FIGS. 2A through 2E are schematic, cross-sectional views showing a method of fabricating metal interconnects according to one preferred embodiment of this invention.

As shown in FIG. 2A, a semiconductor substrate 200 is provided, and preformed devices such as transistors (not shown) can be formed on the substrate 200. An insulating layer (not shown) is formed over the substrate 200. A copper layer 202 is formed over the insulating layer as a conductive line. A first stop layer 204 and a first inter-metal dielectric layer (IMD) 206 are subsequently formed on the copper layer 202, for example, by chemical vapor deposition (CVD). The first stop layer 204 includes, for example, silicon nitride. The first inter-metal dielectric layer 206 includes, for example, silicon oxide. The first inter-metal dielectric layer 206 is as thick as necessary for a required thickness of a subsequently formed via.

A second stop layer 208 and a second inter-metal dielectric layer 210 are subsequently formed on the first inter-metal dielectric layer 206 by a process such as CVD. The second stop layer 208 includes, for example, silicon nitride. The second inter-metal dielectric layer 210 includes, for example, silicon oxide. The second inter-metal dielectric layer 210 and a subsequently formed conductive line have the same surface level.

The second inter-metal dielectric layer 210 and the second stop layer 208 are defined to form openings 212 and 214. Portions of the first dielectric layer 206 are exposed by the openings 212, 214. The method of forming the openings 212 and 214 includes removing a portion of the second inter-metal dielectric layer 210 by photolithography and etching using the second stop layer 208 as an etching stop layer. The second stop layer 208 is over-etched until the first inter-metal dielectric layer 206 is exposed to form the openings 212, 214.

A conformal glue/barrier layer 216 is formed over the substrate 200. The glue/barrier layer 216 can be made of, for example, tungsten/tungsten nitride (W/WN$_x$), tungsten nitride (WN$_x$), tantalum/tantalum nitride (Ta/TaN$_x$), or tantalum nitride (TaN$_x$). Tantalum nitride (TaN$_x$) is highly stable, so the glue/barrier layer 216 is preferably made of tantalum/tantalum nitride (Ta/TaN$_x$), and tantalum nitride (TaN$_x$). The glue/barrier layer 216 is formed, for example, by CVD, or by forming a metal layer over the substrate 200 and then a nitridation is performed on the metal layer. The metal layer includes tantalum or tungsten.

Figure 2B:
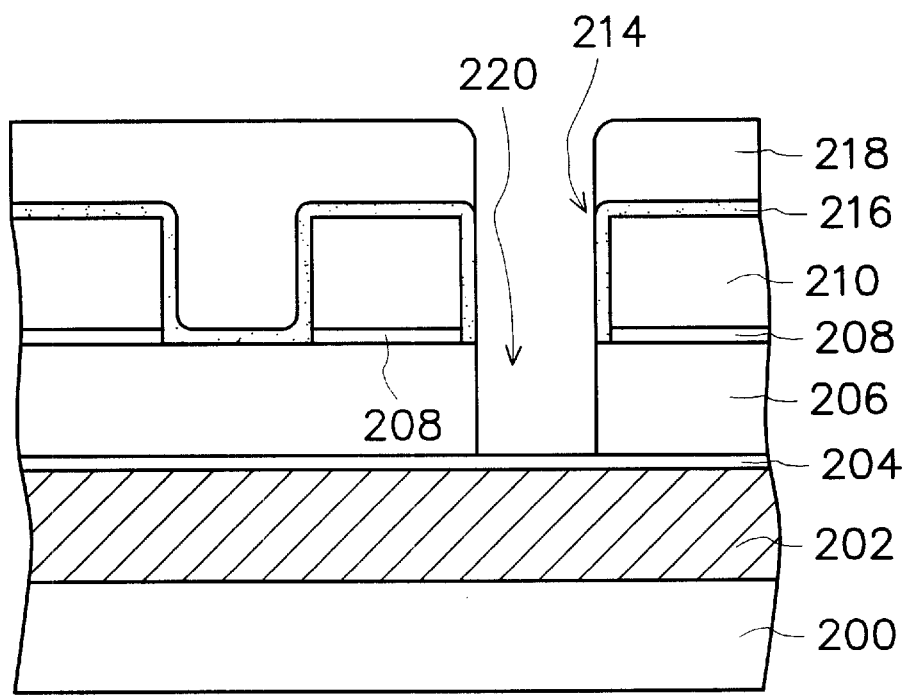

As shown in FIG. 2B, the first inter-metal dielectric layer 206 is defined until a portion of the first stop layer 204 is exposed to form a via hole 220 below the opening 214. The definition step for the first dielectric layer 206 includes forming a patterned photoresist layer 218 over the substrate 200. Using the photoresist layer 218 as a mask and the first stop layer 204 as an etching stop layer, the first inter-metal dielectric layer 206 is etched to form the via hole 220 in the first inter-metal dielectric layer 206 to expose the first stop layer 204. At this step, the glue/barrier layer 216 on sidewalls of the opening 214 is not removed.

Figure 2C:
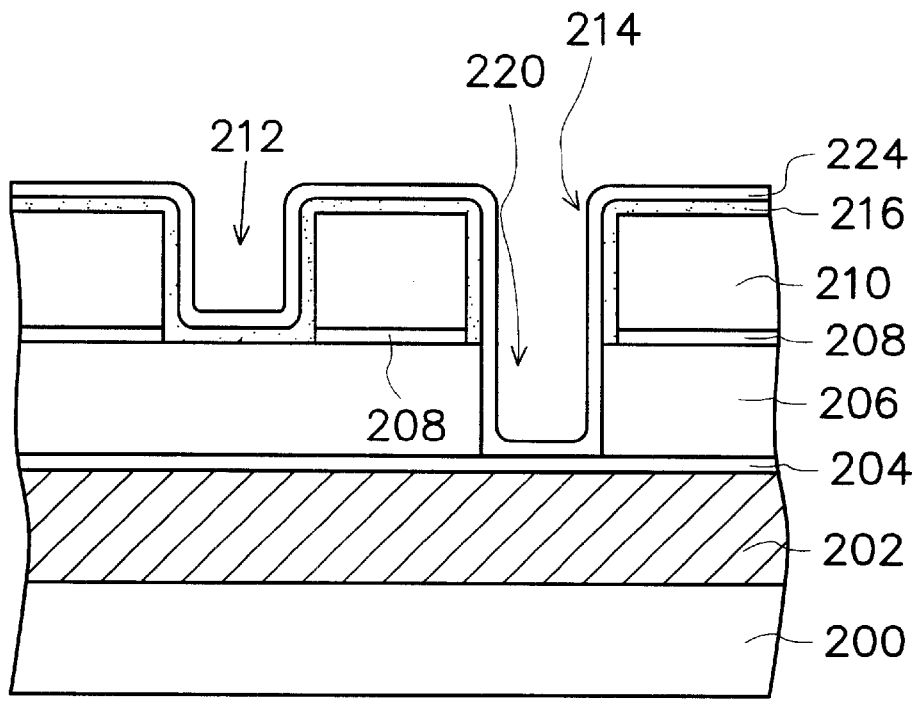

As shown in FIG. 2C, the photoresist layer 218 (FIG. 2B) is removed. Another conformal glue/barrier layer 224 is formed over the substrate 200. The glue/barrier layer 224 includes, for example, tungsten/tungsten nitride (W/WN$_x$), tungsten nitride (WN$_x$), tantalum/tantalum nitride (Ta/TaN$_x$), and tantalum nitride (TaN$_x$), and is preferably made of tantalum/tantalum nitride (Ta/TaN$_x$), or tantalum nitride (TaN$_x$). The glue/barrier layer 224 is formed, for example, by CVD, or by forming a metal layer over the substrate 200 and then performing nitridation on the metal layer. The metal layer includes, for example, tantalum or tungsten.

Figure 2D:
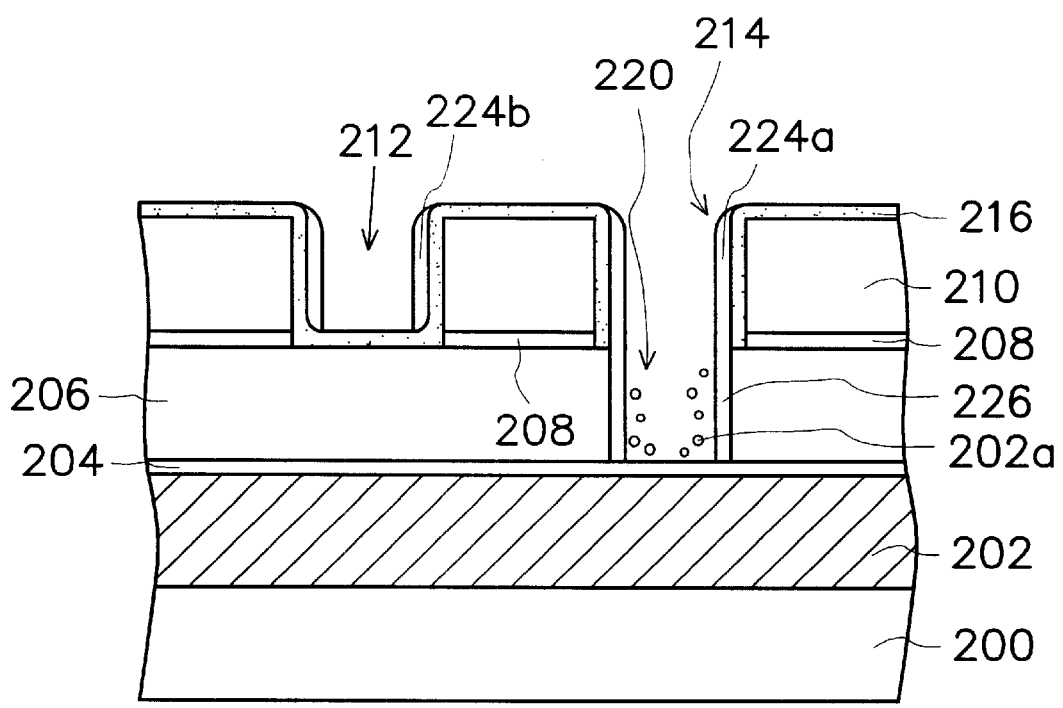

As shown in FIG. 2D, portions of the glue/barrier layer 224 at bottoms of the opening 212 and the via hole 220 are removed to form spacers 224a on the sidewalls of the opening 214 and the via hole 220, and to form spacers 224b on sidewalls of the opening 212. The first stop layer 204 at the bottom of the via hole 220 is further removed until the copper layer 202 is exposed. The method of forming the spacers 224a, 224b includes using the first stop layer 204 as an etching stop layer, and anisotropically etching the glue/barrier layer 224 until the first stop layer 204 is exposed.

The first stop layer 204 exposed by the via hole 220 is removed, for example, by wet etching or dry etching, in which a high selectivity solution is chosen as an etchant. For example, the wet etching process is performed with hot phosphoric acid. Before the spacers 224a, 224b are formed, the opening 212 is covered with the two glue/barrier layers 216 and 224. Therefore, while the glue/barrier layer 224 at the bottom of the via hole 220 is removed, the glue/barrier layer 216 at the opening 212 bottom remains so that the first inter-metal dielectric layer 206 is not exposed.

After the first stop layer 204 exposed by the via hole 220 is etched, the copper layer 202 is exposed. Therefore, portions of copper atoms (or copper ions) 202a are dissociated from surface of the copper layer 202 so that portions of copper atoms (or copper ions) 202a remain at the bottom of the via hole 220. Moreover, after the etching step, a cleaning step is performed to clean the remaining etchants.

The copper atoms (or copper ions) 202a remaining at the bottom of the via hole 220 are taken out to the via hole 220 and the opening 214 by the cleaning step so that the copper atoms (or copper ions) 202a remain on the sidewalls of the via hole 220 and the opening 214 to contaminate devices preformed on the substrate 200. Since the first and second inter-metal dielectric layers 206, 210 are covered with the glue/barrier layers 216, 224 in the invention, the first and second inter-metal dielectric layers 206, 210 are protected from diffusion of the copper atoms (or copper ions) 202a.

Figure 2E:
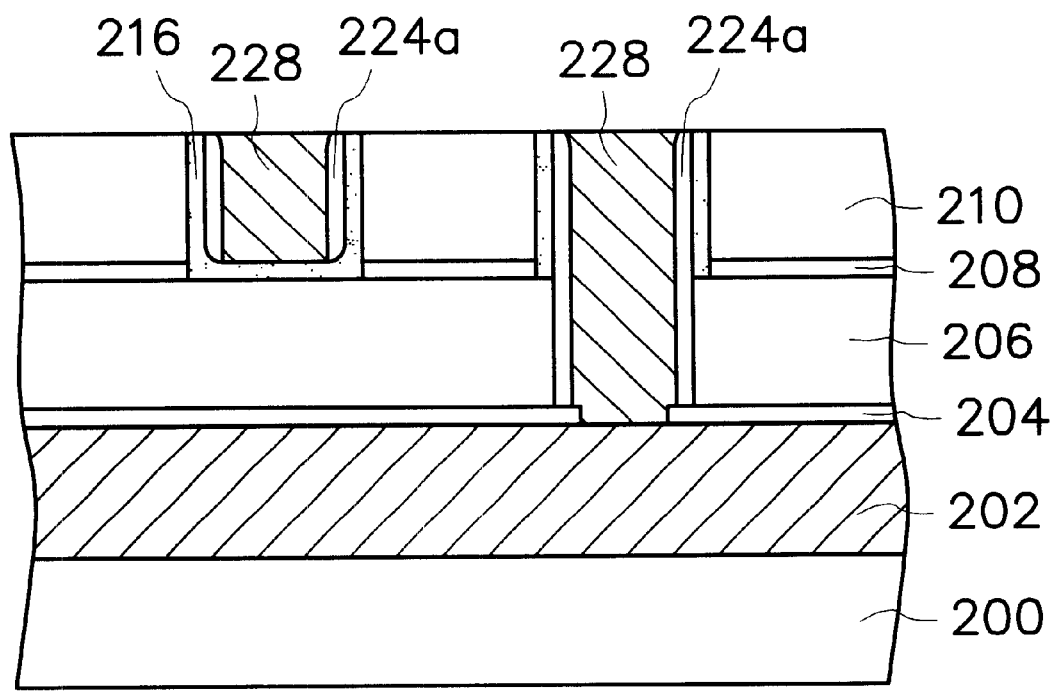

As shown in FIG. 2E, a metal layer such as a copper layer 228, is formed over the substrate 200 to fill the opening 212, 214 and the via hole 220. Using the inter-metal dielectric layer 210 as a removal stop layer, the copper layer 228 on the second inter-metal dielectric layer 210 is removed, for example, by chemical-mechanical polishing. At this step, a metal interconnect is formed.

Accordingly, while metal interconnects are fabricated using copper as a conductive material, the invention is to form a glue/barrier layer to cover surface of an inter-metal dielectric layer before a via hole is formed to expose the conductive line of copper. Therefore, the glue/barrier layer can prevent copper atoms (or copper ions) from diffusing into the inter-metal dielectric layer so that contamination of devices preformed on the substrate caused by the copper atoms and copper ions is avoided. In addition, unexpected electrical connection between two isolated metal layers caused by the copper atoms or copper ions diffusion can also be avoided. Therefore, the invention can enhance reliability of metal interconnects.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating metal interconnects on a semiconductor substrate, comprising the steps of:

sequentially forming a copper layer, a first stop layer, a first inter-metal dielectric layer, a second stop layer, and a second inter-metal dielectric layer over the substrate;

patterning the second inter-metal dielectric layer and the second stop layer to form an opening;

forming a conformal first glue/barrier layer over the second inter-metal layer and the opening;

patterning the first glue/barrier layer and the first inter-metal layer to form a via hole below the opening until the first stop layer is exposed;

forming spacers on sidewalls of the opening and the via hole below the opening; and removing a portion of the first stop layer beneath the via hole to expose the copper layer.

2. The method according to claim 1, wherein the first glue/barrier layer and the spacers comprise tungsten/tungsten nitride (W/WN$_x$).

3. The method according to claim 1, wherein the first glue/barrier layer and the spacers comprise tungsten nitride (WN$_x$).

4. The method according to claim 1, wherein the first glue/barrier layer and the spacers comprise tantalum/tantalum nitride (Ta/TaN$_x$).

5. The method according to claim 1, wherein the first glue/barrier layer and the spacers comprise tantalum nitride (TaN$_x$).

6. The method according to claim 1, wherein the step of forming the spacers comprise:

forming a conformal second glue/barrier layer over the first glue/barrier layer, the opening and the via hole below the opening; and anisotropically etching the second glue/barrier layer using the first stop layer as an etching stop layer to form the spacers on the sidewalls of the opening and the via hole below the opening, until the first stop layer is exposed.

7. The method according to claim 1, wherein the step of forming the first glue/barrier layer comprises:

forming a metal layer over the second inter-metal layer and the opening;

performing a nitridation process on the metal layer.

8. The method according to claim 7, wherein the metal layer comprises tantalum.

9. The method according to claim 7, wherein the metal layer comprises tungsten.

10. The method according to claim 1, wherein after the first stop layer is removed, a cleaning step is performed on the substrate.

11. The method according to claim 1, wherein the via hole is formed using the first stop layer as an etching stop layer.

12. The method according to claim 1, wherein the step of forming the opening comprises:

removing a portion of the second inter-metal dielectric layer by photolithography and etching using the second stop layer as an etching stop layer; and over-etching the second stop layer until the first inter-metal layer is exposed.

13. The method according to claim 1, wherein the first stop layer and the second stop layer comprise silicon nitride.

14. A method of fabricating metal interconnects on a semiconductor substrate, comprising the steps of:

sequentially forming a copper layer, a stop layer, and an inter-metal dielectric layer over the substrate;

patterning the inter-metal dielectric layer to form an opening in the inter-metal dielectric layer;

forming a first conformal glue/barrier layer over the inter-metal dielectric layer and the opening;

removing the first conformal glue/barrier layer at the bottom of the opening and a portion of the inter-metal dielectric layer underlying said bottom to form a via;

forming a second conformal glue/barrier layer over the first conformal glue/barrier layer;

etching the second glue/barrier layer to form spacers on sidewalls of the opening and the via, the spacers extending to the stop layer exposed by the via, wherein the spacers and the first conformal glue/barrier layer serve as a diffusion barrier layer; and after forming the spacers, removing a portion of the stop layer to expose the copper layer.

15. The method according to claim 14, wherein the stop layer comprises silicon nitride.

16. The method according to claim 14, wherein the step of etching the second glue/barrier layer comprises anisotropically etching the second glue/barrier layer using the stop layer as an etching stop layer.

17. The method according to claim 14, wherein the second glue/barrier layer comprises tungsten/tungsten nitride (W/WN$_x$).

18. The method according to claim 14, wherein the second glue/barrier layer comprises tungsten nitride (WN$_x$).

19. The method according to claim 14, wherein the second glue/barrier layer comprises tantalum/tantalum nitride (Ta/TaN$_x$).

20. The method according to claim 14, wherein the second glue/barrier layer comprises tantalum nitride (TaN$_x$).

* * * * *